United States Patent
Sun et al.

(10) Patent No.: US 10,211,634 B2
(45) Date of Patent: Feb. 19, 2019

(54) DYNAMIC STATE ESTIMATION OF POWER DISTRIBUTION SYSTEM

(71) Applicant: Mitsubishi Electric Research Laboratories, Inc., Cambridge, MA (US)

(72) Inventors: Hongbo Sun, Lexington, MA (US); Guangyu Feng, Beijing (CN)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 255 days.

(21) Appl. No.: 15/052,159

(22) Filed: Feb. 24, 2016

(65) Prior Publication Data
US 2017/0244250 A1    Aug. 24, 2017

(51) Int. Cl.
| | |
|---|---|
| H02J 3/00 | (2006.01) |
| H02J 3/18 | (2006.01) |
| G05B 17/02 | (2006.01) |
| G01R 19/25 | (2006.01) |
| G06Q 50/06 | (2012.01) |

(52) U.S. Cl.
CPC .......... *H02J 3/18* (2013.01); *G01R 19/2513* (2013.01); *G05B 17/02* (2013.01); *G06Q 50/06* (2013.01)

(58) Field of Classification Search
CPC .... H02J 3/00; H02J 3/18; H05B 17/02; G01R 19/2513; G06Q 50/06
See application file for complete search history.

(56) References Cited

U.S. PATENT DOCUMENTS

| | | | | |
|---|---|---|---|---|
| 2013/0304266 A1* | 11/2013 | Giannakis | ............ | G01R 21/133 700/286 |
| 2016/0036226 A1* | 2/2016 | Gan | .......................... | H02J 3/00 700/286 |
| 2016/0103162 A1* | 4/2016 | Safa-Bakhsh | ........... | B60R 16/03 702/62 |

FOREIGN PATENT DOCUMENTS

| | | |
|---|---|---|
| CN | 101615794 A | 12/2009 |
| WO | 2013187975 A1 | 12/2013 |

* cited by examiner

*Primary Examiner* — Phuc Dang
(74) *Attorney, Agent, or Firm* — Gene Vinokur; James McAleenan; Hironori Tsukamoto

(57) ABSTRACT

A method for dynamic state estimation (DSE) in a power distribution system (PDS) determines a new state of the PDS from a current state of the PDS via an indirect state transition model defining a transition of the current state of the PDS to the new state of the PDS through a transition of a current power injection to a new power injection on each bus of the PDS. The method measures one or combination of power flows, power injections, voltage magnitudes and phase angles on the measuring buses in the PDS and updates the new state of the PDS based on corresponding differences between one or combination of the estimated power flows, the estimated power injections, the estimated voltage magnitudes and the estimated phase angles with the measured power flows, the measured power injections, the measured voltage magnitudes and the measured phase angles.

20 Claims, 10 Drawing Sheets

DYNAMIC STATE ESTIMATION OF POWER DISTRIBUTION SYSTEM

FIELD OF THE INVENTION

This invention relates to power distribution systems, more specifically relates to dynamic state estimation for a power distribution system.

BACKGROUND OF THE INVENTION

Accurate state estimation is an integral part of maintaining safe operating conditions of power distribution systems and serves as input for control functionalities, such as economic dispatch and optimal power flow problems. State estimation can be divided into two categories, one is static state estimation and the other is dynamic state estimation.

In static state estimation, the system state is inferred using only measurements from the current snapshot in time. The motivation behind dynamic state estimation is to use information from prior measurements in addition to the current measurements to make an improved estimate. The dynamic state estimation is a large-scale nonlinear state estimation problem for a practical power distribution system. The solution accuracy and efficiency of dynamic state estimation method plays a crucial role for the success of its real-time applications.

For example, the method described in CN 101615794 A discloses a dynamic state estimation method for an electrical power system based on an unscented Kalman filter (UKF). However, that method requires a state transition model in addition to measurement model to be available. Due to infeasibility for acquiring explicit state transition models for a practical power system, the exponential smoothing based approach was used to fit the state transit model bus by bus. However, the fitting of state transition model suffers from lack of physical meaning and neglects the dependence between states of different buses. Therefore, the UKF that used this state transition model may not provide sufficient accurate estimation results for a complex power system, such as a practical power distribution system.

Accordingly, there is still a need for a system and a method for dynamic state estimation of a power distribution system.

SUMMARY OF THE INVENTION

It is an object of some embodiments of the intention to provide a system and a method for dynamic state estimation of a power distribution system. It is another object of one embodiment of the invention to provide such a method for dynamic state estimation that is suitable for dynamic state estimation of a power distribution system with distributed generations.

Some embodiments of the invention are based on a realization that the changes of states of a power distribution system are actually driven by the power injections, i.e. the differences between the power outputs of the generators at buses and the power consumptions of the loads at the buses. To that end, some embodiments, in contrast with the state transition model that neglects the dependence between states of different buses, use an indirect state transition model to implement dynamic state estimation of power distribution system.

The indirect state transition model defines a transition of a state of the power distribution system to a new state of the power distribution system through a transition of a power injection to a new power injection on each bus of the power distribution system. In some embodiments, the state is first transformed into power injections by using power injection equations, the power injections is transformed into a new power injection based on a power injection transition model and, the new power injection is further transformed into a new state by executing a power flow solution.

Compared with state changes, the changes of bus power injections are easier to follow and explain, and more importantly the bus power injections are independent from each other. Considering the relatively short time interval between each measurement update for dynamic state estimation (for example, a few minutes or less), the power injection can be forecasted based on its historical data using, e.g., time-series, or regression techniques such as exponential smoothing technique.

Accordingly, one embodiment of the invention discloses a method for dynamic state estimation (DSE) in a power distribution system (PDS) with distributed generations. The method includes determining a new state of the PDS from a current state of the PDS via an indirect state transition model defining a transition of the current state of the PDS to the new state of the PDS through a transition of a current power injection to a new power injection on each bus of the PDS, wherein the new state defines an estimation of power flows, power injections, voltage magnitudes and phase angles for the buses in PDS including measuring buses in the PDS; measuring one or combination of power flows, power injections, voltage magnitudes and phase angles on the measuring buses in the PDS; and updating the new state of the PDS based on corresponding differences between one or combination of the estimated power flows, the estimated power injections, the estimated voltage magnitudes and the estimated phase angles with the measured power flows, the measured power injections, the measured voltage magnitudes and the measured phase angles. At least some steps of the method are performed by a processor.

Another embodiment of the invention discloses a method for dynamic state estimation (DSE) in a power distribution system (PDS) with distributed renewable generations. The method includes determining an indirect state transition model defining a transition of a current state of the PDS to a new state of the PDS through a transition of a current power injection to a new power injection on each bus of the PDS; determining the transition of the current power injection to the new power injection using a level of the current power injection and a trend of the current power injection; determining the new state of the PDS from the new power injection; and updating the new state of the PDS based on corresponding differences between new power flows, new power injections, new voltage magnitudes and new phase angles corresponding to the new state with measurements of power flows, power injections, voltage magnitudes and phase angles for at least some buses in the PDS. At least some steps of the method are performed by a processor.

Yet another embodiment discloses a control system of a power distribution system (PDS), including a memory to store a current state of the PDS and an indirect state transition model defining a transition of the current state of the PDS to a new state of the PDS through a transition of a current power injection to a new power injection on each bus of the PDS; a set of sensors arranged at measuring buses in the PDS to measure one or combination of power flows, power injections, voltage magnitudes and phase angles on the measuring buses in the PDS; and a processor to determine a new state of the PDS from the current state of the PDS via the indirect state transition model and to update, using a unscented Kalman filter, the new state of the PDS based on corresponding differences between one or combination of corresponding differences between new power flows, new power injections, new voltage magnitudes and new phase angles corresponding to the new state with the measurements of power flows, power injections, voltage magnitudes and phase angles for at least some buses in the PDS.

DETAILED DESCRIPTION OF THE PREFERRED EMBODIMENTS

Indirect State Transition Model

Figure 1A:
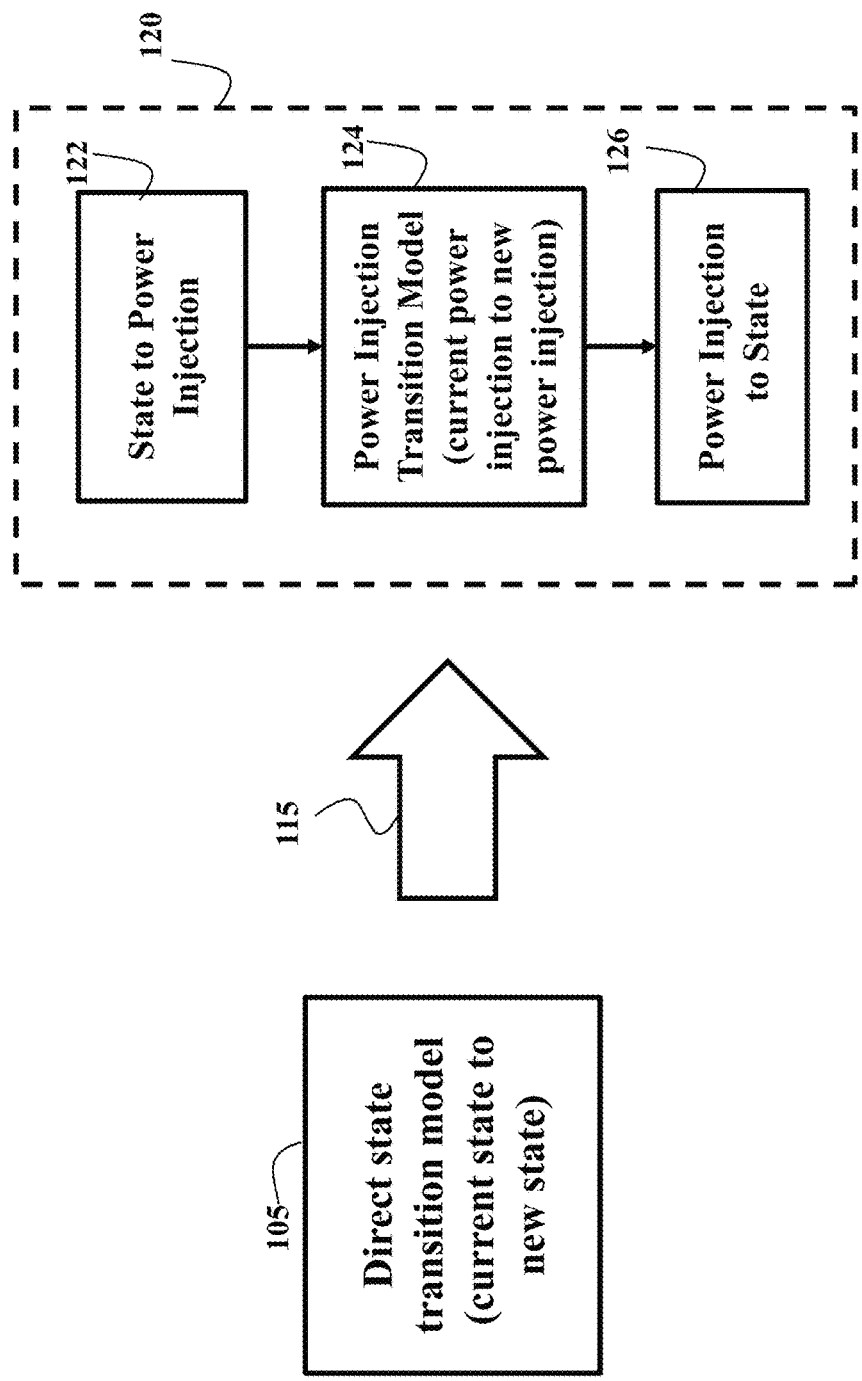
FIG. 1A is a schematic of transforming a direct state transition model into an indirect state transition model according to some embodiments of the invention.

The states of a power distribution system can be described by the magnitude and phase angle of phase voltages at each bus. The states are usually not directly and fully measured, but have to be estimated based on available measurements. The commonly used measurement types for a power distribution system includes active and reactive phase power flows on a branch, active and reactive phase power injections on a bus, the magnitude of phase voltage on a bus, and the phase angle of phase voltage of a bus.

The dynamic state estimation of a power distribution system are based on a state transition model and a measurement model as described below:

$$x(k)=f[x(k-1),k-1]+q(k), \qquad (1)$$

$$y(k)=h[x(k),k]+r(k), \qquad (2)$$

where $x(k)$ and $y(k)$ are the state vector and measurement vector at time interval k, $q(k)$ and $r(k)$ are the Gaussian noise vectors for state and measurement at time interval k and modeled as random numbers with zero means and uncorrelated covariance matrices, $Q(k)$ and $R(k)$ respectively. $f(\cdot)$ and $h(\cdot)$ are the state transition equations and measurement equations respectively.

For a power distribution system, the measurement models are typically described as a set of nonlinear equations of state variables. Taken the bus power injections as example, power injections can be related to bus voltages according to:

$$P_{i,x} = \mathrm{Re}\left\{V_{i,x}e^{j\theta_{i,x}}\left[\sum_{j\in BUS, y\in PH^i}(Y^{SYS}_{i,x-j,y}V_{j,y}e^{j\theta_{j,y}})^*\right]\right\}, \text{ and} \qquad (3)$$

$$Q_{i,x} = \mathrm{Im}\left\{V_{i,x}e^{j\theta_{i,x}}\left[\sum_{j\in BUS, y\in PH^i}(Y^{SYS}_{i,x-j,y}V_{j,y}e^{j\theta_{j,y}})^*\right]\right\},$$

where, $P_{i,x}$ and $Q_{i,x}$ are the active and reactive power injection at bus i and phase $x$. $_{BUS}$ is the set of buses in the system, $PH^i$ is the set of phases at bus i; $V_{i,x}$ and $\theta_{i,x}$ are the voltage and phase angle of at bus i on phase x; $V_{j,y}$ and $\theta_{j,y}$ are the voltage and phase angle at bus j on phase y; $Y^{SYS}_{i,x-j,y}$ is the element of system admittance matrix at the row corresponding to bus i and phase x, and the column corresponding to bus j and phase y. The system admittance matrix $Y^{SYS}$ can be determined according to the device connections in the system, and corresponding branch admittance matrices for each device. The set of power injection equations for all buses in the system are usually called power flow equations. Solving power flow refers to determining the voltage magnitudes and phase angles when the power injections are given.

Similarly, the phase power flows at a two-terminal device can be related to the phase voltages at two terminal buses as:

$$P_{ij,x} = \mathrm{Re}\left\{V_{i,x}e^{j\theta_{i,x}}\left[\sum_{y\in PH^{ij}}(Y^{ij}_{i,x-i,y}V_{i,y}e^{j\theta_{i,y}} + Y^{ij}_{i,x-j,y}V_{j,y}e^{j\theta_{j,y}})^*\right]\right\}, \text{ and} \qquad (4)$$

$$Q_{ij,x} = \mathrm{Im}\left\{V_{i,x}e^{j\theta_{i,x}}\left[\sum_{y\in PH^{ij}}(Y^{ij}_{i,x-i,y}V_{i,y}e^{j\theta_{i,y}} + Y^{ij}_{i,x-j,y}V_{j,y}e^{j\theta_{j,y}})^*\right]\right\},$$

$$P_{ji,x} = \mathrm{Re}\left\{V_{i,x}e^{j\theta_{j,x}}\left[\sum_{y\in PH^{ij}}(Y^{ij}_{j,x-i,y}V_{i,y}e^{j\theta_{i,y}} + Y^{ij}_{j,x-j,y}V_{j,y}e^{j\theta_{j,y}})^*\right]\right\}, \text{ and} \qquad (5)$$

$$Q_{ji,x} = \mathrm{Im}\left\{V_{j,x}e^{j\theta_{j,x}}\left[\sum_{y\in PH^{ij}}(Y^{ij}_{j,x-i,y}V_{i,y}e^{j\theta_{i,y}} + Y^{ij}_{j,x-j,y}V_{j,y}e^{j\theta_{j,y}})^*\right]\right\},$$

where, $P_{ij,x}$ and $Q_{ij,x}$, $P_{ji,x}$ and $Q_{ji,x}$ are the active and reactive powers flowing from bus i towards bus j, and from bus j towards bus i on phase x of the branch respectively; $V_{j,x}$ and $\theta_{j,x}$ are the voltage and phase angle of at bus j on phase x; $PH^{ij}$ is the set of energized phases for the device between bus i and bus j; $Y^{AC\text{-}ij}_{i,x-i,y}$, $Y^{AC\text{-}ij}_{i,x-j,y}$, $Y^{AC\text{-}ij}_{j,x-i,y}$ and $Y^{AC\text{-}ij}_{j,x-j,y}$ are the elements of branch admittance matrix for the device, at the row and column given by the subscript letters, in which the first twos give the corresponding bus and phase of the row, and last twos give the corresponding bus and phase of the column. The branch admittance matrix $Y^{AC\text{-}ij}$ is used to define the relationship between the injected currents and voltages at each phase of terminals buses on the branch. It is a square matrix, and the size of its rows equals to twice the total number of available phases of the branch. The formulation of branch admittance matrix can be different for different types of devices. For a line segment, its branch admittance matrix is defined by its series impedances and its shunt admittances. For a transformer, its admittance matrix is defined by its winding connections, tap positions, and impedances.

If the direct state transition model is known, the dynamic state estimation for a power distribution system can be implemented using nonlinear state estimation techniques, such as Unscented Kalman Filter. The unscented Kalman filter technique is used in this patent due to its capability in handling nonlinear state estimations. However, it is usually not realistic nor easy for a complex power distribution system to obtain explicit state equations.

FIG. 1A shows a schematic of transforming 115 a direct state transition model 105 into an indirect state transition model 120 according to some embodiments of the invention. The embodiments are based on recognition that because the changes of states are actually driven by the power injections, i.e. the differences between the powers generated by the generators at buses and the power consumed by the loads at the buses, the indirect state transition model can define a transition of a current state to a subsequent state through a transition of a current power injection to a subsequent power injection. Specifically, the indirect state transition model converts the state of the PDS to power injections 122, generates new power injection using power injection transition model 124, and converts the new power injections into new states 126.

The indirect state transition model can be described as follows:

$$s(k-1)=c[x(k-1)], \quad (6)$$

$$s(k)=g[s(k-1),k-1]+v(k), \quad (7)$$

$$x(k)=c^{-1}[s(k)], \quad (8)$$

wherein s(k) and v(k) are the vectors of phase power injections and the Gaussian noises at time interval k respectively. c(•) is the set of equations relating power injections to states equations as described in (3). g(•) is the set of equations describing the transitions of power injections which will be discussed in next section.

The state at interval (k−1) is first transformed into power injections at interval (k−1) by using power injection equations (6), then a power injection at interval k is predicted based on power injection transition model (7), and the power injection at interval k is further transformed into the state at interval k by executing a power flow solution (8).

Compared with state changes, the changes of bus power injections are easier to follow and explain, and more importantly the bus power injections are independent from each other. Therefore, the invented method is expected to yield more accurate results that existing approaches.

Figure 1B:
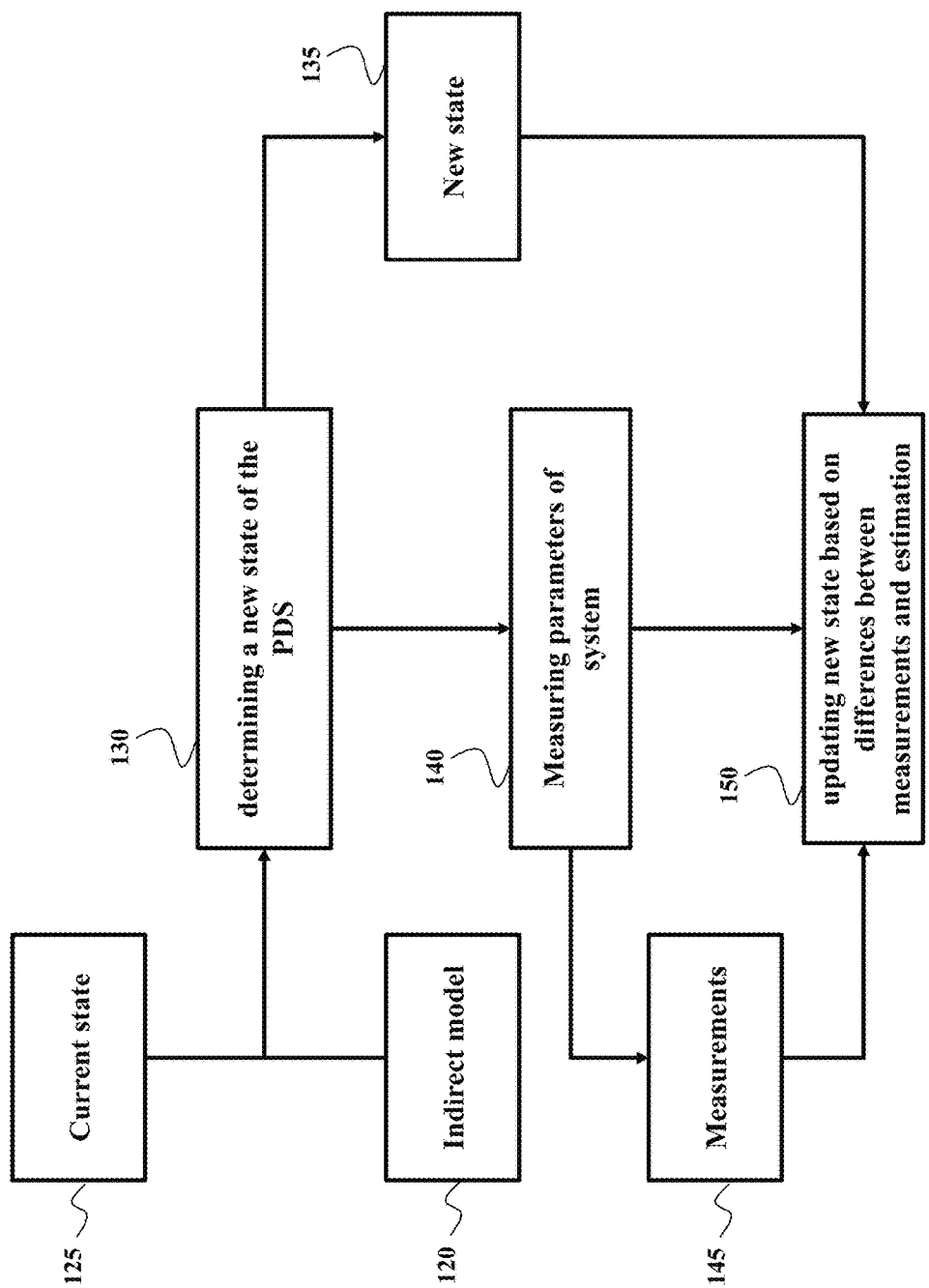
FIG. 1B is a block diagram of a method for dynamic state estimation (DSE) in a power distribution system (PDS) according to one embodiment of the invention.

FIG. 1B shows a block diagram of a method for dynamic state estimation (DSE) in a power distribution system (PDS) with distributed generations according to one embodiment of the invention. The method determines 130 a new state 135 of the PDS from a current state 125 of the PDS via an indirect state transition model 120. The estimation of the new state is then used to provide the estimation of the different parameters of the PDS, such as the estimation of power flows, the estimation of power injections, the estimation of voltage magnitudes and the estimation of phase angles for the buses in PDS including measuring buses in the PDS. As used herein, measuring buses in the PDS are the buses associated with sensors capable to measure the parameters of the system at those buses.

The indirect state transition model 120 defines a transition of the current state of the PDS to the new state of the PDS through a transition of a current power injection to a new power injection on each bus of the PDS. For example, the indirect state transition model 120 transforms 122 the current states of the PDS into the current power injection on each bus of the PDS, determines 124 the new power injection on each bus of the PDS from the power injection using a level and a trend of the power injection, and transforms 126 the new power injection into the new state of the PDS.

The method also measures 140 one or combination of power flows, power injections, voltage magnitudes and phase angles on the measuring buses in the PDS to produce measurements 145 and updates 150 the new state of the PDS based on corresponding differences between one or combination of the estimated power flows, the estimated power injections, the estimated voltage magnitudes and the estimate phase angles of the new state 135 with the measured 145 power flows, the measured power injections, the measured voltage magnitudes and the measured phase. In some embodiment, the updating is performed using a Kalman filter.

Figure 2A:
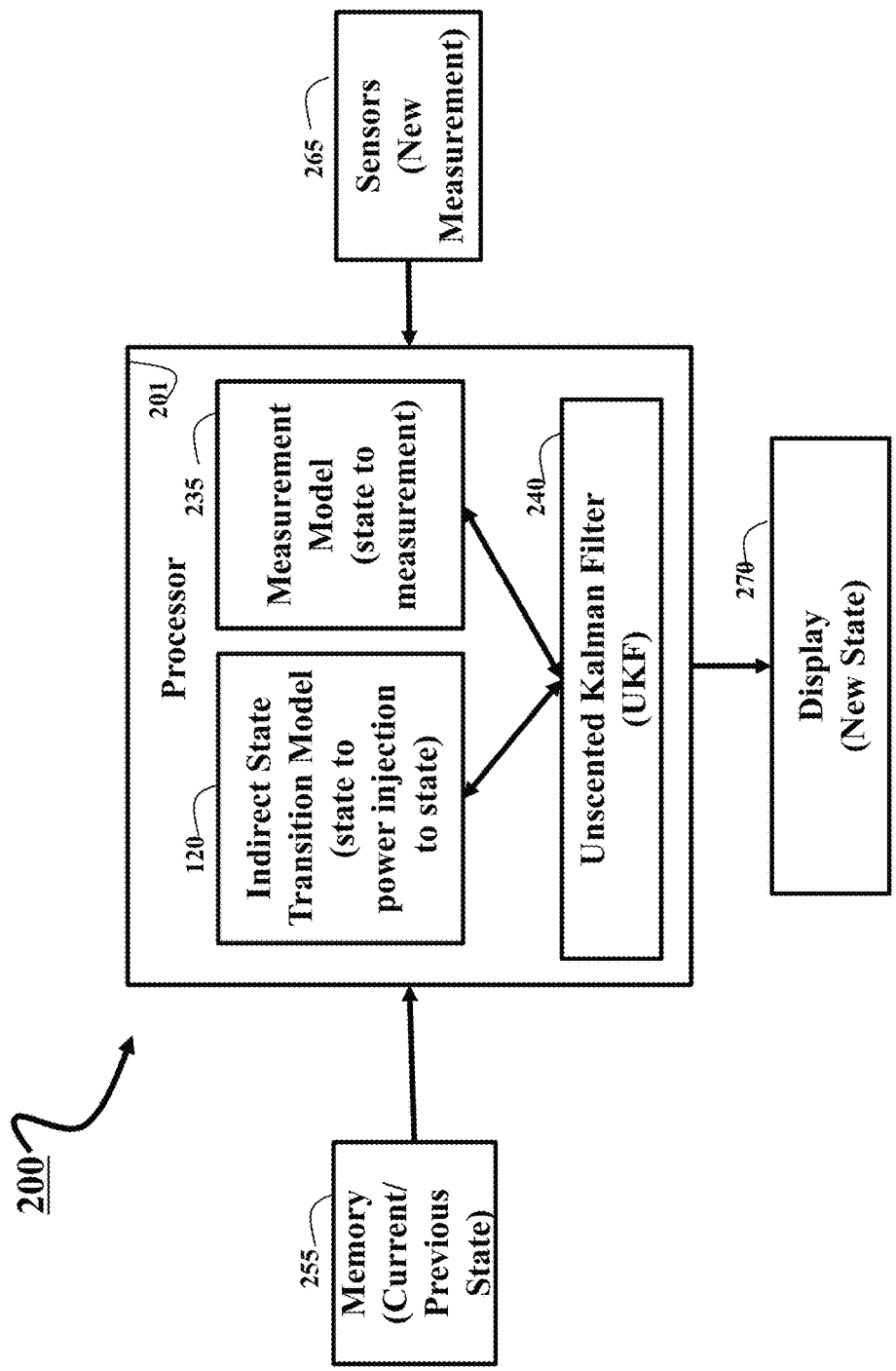
FIG. 2A is a schematic of control system of a PDS according to some embodiments of the invention.

FIG. 2A is a schematic of control system 200 of a power distribution system (PDS), according to some embodiments of the invention. The control system can include one or combination of a memory 255, a set of sensors 265, a processor 201, and a display/screen 270. In various embodiments, the method of FIGS. 1A and/or 1B is implemented using the control system 200.

For example, the set of sensors 265 can include remote measurement units which provide measurements for phase power flows for a branch, phase power injections for a bus, and phase voltage magnitude for a bus. The sensors 265 can also include phasor measurement units which provide the magnitude and angle of phase voltages for a bus.

In some embodiments, the processor 201 can include three functionality blocks, an indirect state transition model block 120, a measurement model block 235, and an unscented Kalman filter block 240. The data receiving, estimation execution, and results transmitting are implemented in the processor.

The system can also include a screen or display 270. In some embodiments, the result of the state estimation can be rendered on the display 270 or submitted to different applications that can be internal or external to the system. For example, the results can be sent to a real-time monitoring and security analysis application which can be added to the processor 201.

The memory 255 can be implemented within the processor 201 and/or external to the processor 201. In some embodiments, the memory 255 stores previous and current states of the system and parameters of the system. For example, the memory 255 can store the current state 125 of the PDS and an indirect state transition model 120. Additionally or alternatively, the memory 255 can store the instruction to the processor 201 to determine the new state from the current state via the indirect state transition model 120.

Similarly, the memory 255 can store the measurement model 235 and/or instructions to the processor 201 of how to use the measurement model. For example, in various embodiments, the processor 201 determines estimations of the new power flows, new power injections, new voltage magnitudes and new phase angles corresponding to the new state 135 using the measurement model that relates the measurements to state variables.

Figure 2B:
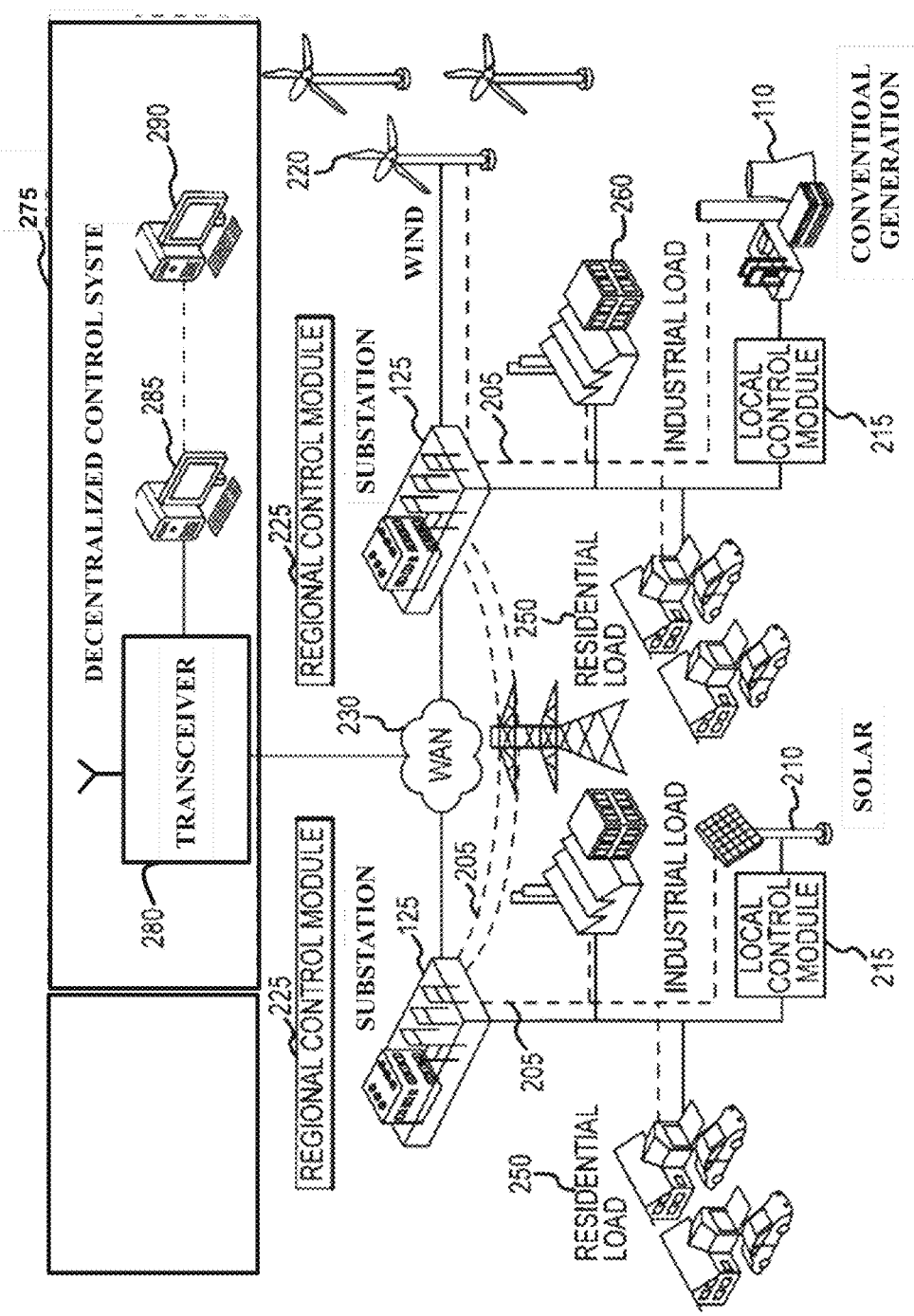
FIG. 2B is a schematic of an exemplar PDS controlled according to one embodiment of the present invention.

FIG. 2B shows a schematic of an exemplar PDS controlled according to one embodiment of the present invention. The conventional power generation facilities 110 are coupled to substations 125 as are renewable source of the energy such as wind turbine farms 220 and solar arrays 210. While FIG. 2B shows three forms of power generation, one skilled in the art will recognize that the present invention is applicable to any form of power generation or energy source. Indeed some embodiments of the invention are equally capable of managing power added to the distributed energy grid from batteries as may be found in electric vehicles as long as the power is compatible with the grid format.

Associated with each substation 125 is a regional control module 225. The regional control module manages power production, distribution, and consumption within its region. Also associated with each region are industrial/commercial loads 260 representative of industrial plant or large commercial enterprises and/or residential loads 250. According to some embodiments of the invention, each regional control module using one or more applications is operable to manage the power distribution and production within its region.

For example, in some embodiments of the invention, each regional control module is an independent regional energy operator distributing energy between energy generators and loads located within a corresponding region. In addition to control the electricity within the region, the regional energy operator can supply the excess of the electricity into the grid, or consume needed electricity from the grid. For example, depending on the time of the day, weather conditions, and other circumstances influencing energy production and consumption, the regional energy operator is the energy provider when the energy generators of the region produce more energy than demanded by the loads in the region. Alternatively, the regional energy operator is the energy consumer when the energy generators of the region produce less energy than demanded by the loads in the region. Different energy operators are interconnected with a main power grid 205 (shown in dashed lines).

In some implementations, power producing entity 210, such as the power generation plants 110 and the renewable or alternative energy sources 220, interfaces with the regional grid via a local control module 215. The local control module 215 can standardize control command responses with each of the plurality of power providers. By offering to the regional control module 225 a standardized response from each of the plurality of power producing entities, the regional control module can actively manage the power distribution grid in a scalable manner. The regional control module 225 is further aware of the electricity producing capacity within the region and the limitations to the distribution grid. The regional control module 225 understands topology with respect to the power providers and power consumers and its own ability to distribute the power.

Each regional control module 225 is communicatively coupled to a control system 275 via, e.g., a wide area network 230. The wide area network can be the Internet or other means to communicate data among remote locations. Additionally or alternatively, the data can be exchanged between the control system 275 and the regional control modules 225 via a local area network or Intranet. To that end, the control system 275 includes a transceiver 280 for exchanging data between the control system and regional control modules 225 via the network 230. Also, control system 275 includes one or several processors 285 and 290 to balance amounts of electricity passing through an electrical grid.

The control system 275 is operable to manage the interaction of several regional control modules 225 and the power providers under their control. As previously described, each regional control module 225 using applicable applications can dynamically manage the power consumers and power providers within its control. As demand (active power or reactive power) within a certain region managed by a regional control module 225 increases or decreases, the regional control module 225 needs to act to compensate for power production within a particular region. To that end, the regional control module 225 makes a decision about supplying or requesting the electricity from the grid. The control system 275 receives, transmits or retransmits such request to balance amount of electricity going in or off the grid.

Different embodiments of the invention control one or combination of the voltages on the buses of the PDS and/or a power generation and a load demand in the PDS. For example, one embodiment determine voltages on the buses from the new states of the PDS and control voltage regulation devices of the PDS to drive the voltages on the buses toward a predetermine level. For example, the control system 275 issues a command to the regional control module 225 to control their voltage regulation devices.

Additionally or alternatively, some embodiments control one or combination of a power generation and a load demand in the PDS. For example, the control system 275 issues a command to the regional control module 225 to increase an active or a reactive power injection into a bus when voltage on the bus is above a first threshold and to decrease the active or the reactive power injection into the bus when voltage on the bus is below a second threshold.

Power Injection Determination of Power Distribution System

Figure 3:
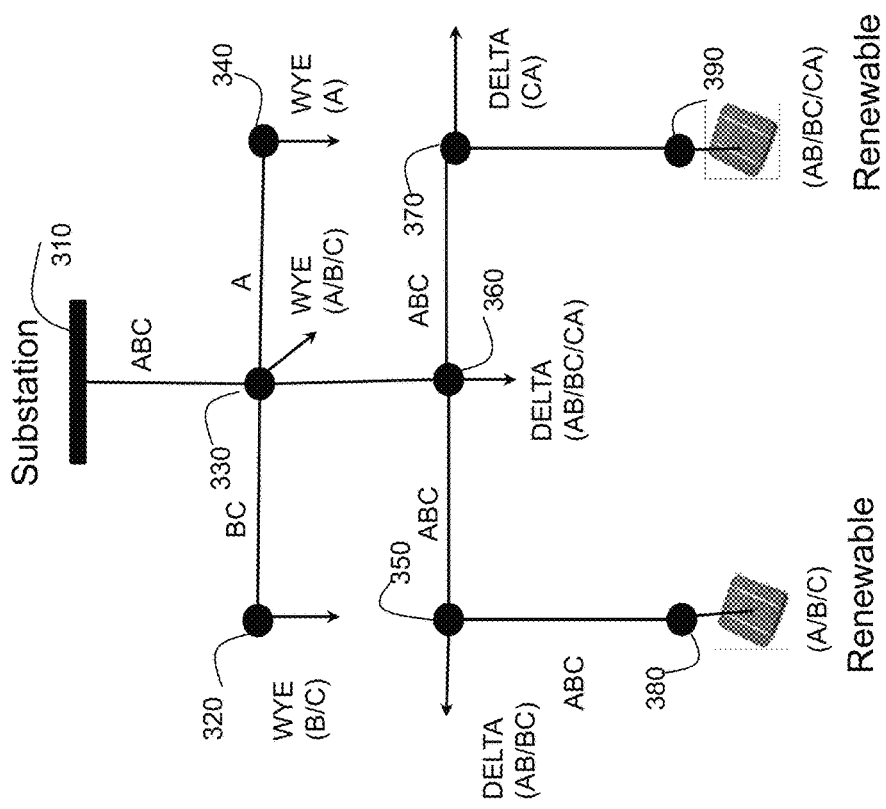
FIG. 3 is an example of three-phase PDS controlled according to the principles of some embodiment of the invention.

FIG. 3 shows an example of three-phase PDS controlled according to the principles of some embodiment of the invention. The system includes a substation bus 310 that connected with the main grid, and two generation buses, 380 and 390 that connected with WYE-connected and DELTA-connected renewable generations respectively. There are six load buses, including three WYE-connected ones 320, 330 and 340, and three DELTA-connected ones, 350, 360 and 370. Typically a power distribution system is an unbalanced system, its buses and devices can be three-phase unbalanced. For example, the line between bus 320 and bus 330 only have two phases, B and C. Meanwhile, the line between bus 330 and bus 340 has only one phase A. Due to the unbalanced nature of distribution systems, the states of distribution systems should be estimated for each phase, and accordingly the measurements need to be given per phase as well.

The loads and distributed generations can be connected to a bus through either a WYE-connection, or a DELTA-connection. The distributed generations can be regulated using constant active power and constant voltage magnitude mode, or constant active power and constant reactive power mode. The loads can include constant-power components, constant-current components, and constant-impedance components. In one embodiment, all loads are treated as constant power loads, and all distributed generations are regulated as constant active power and constant reactive power mode.

Figure 4A:
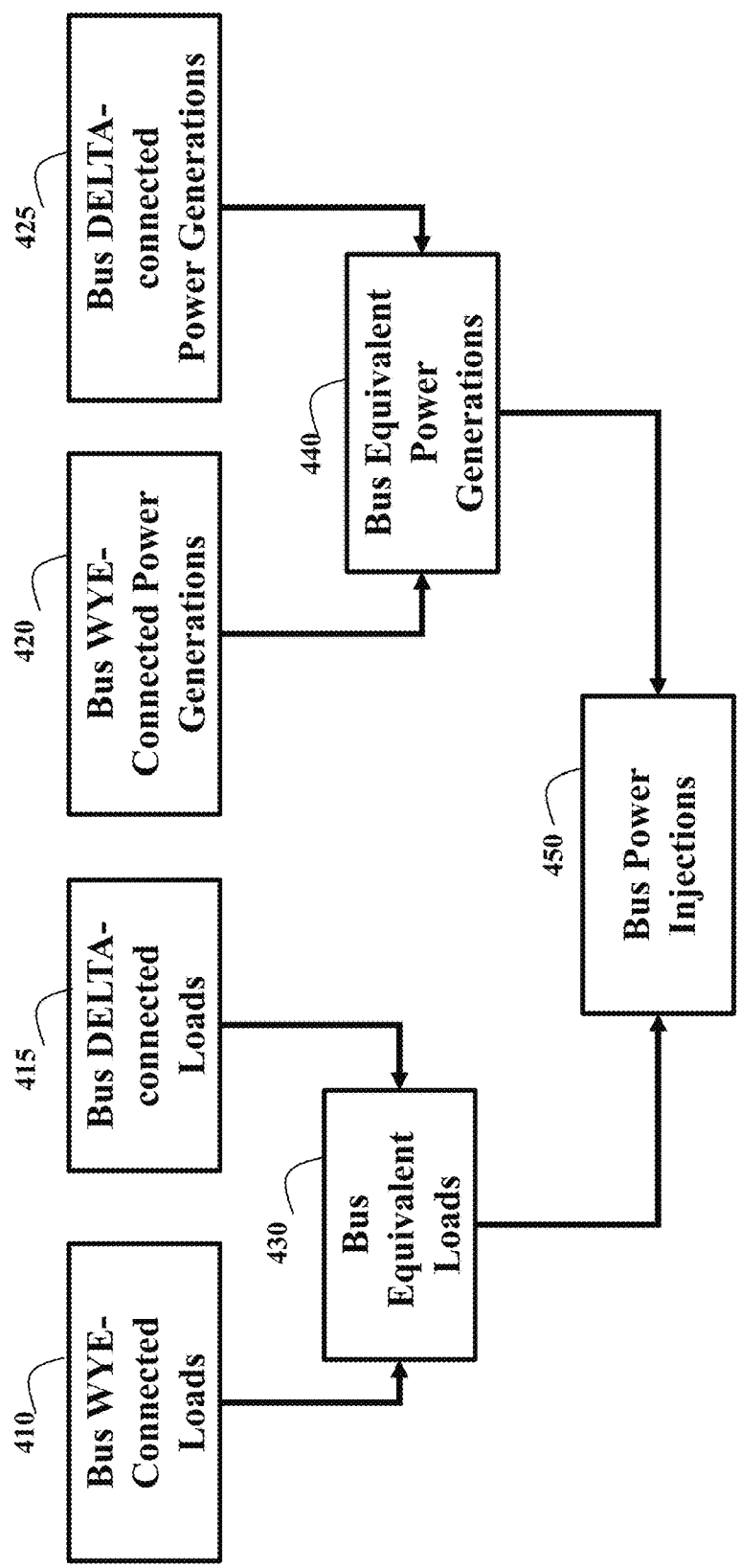
FIG. 4A is a schematic of determining current power injections on a bus of a power distribution system according to some embodiments of the invention.

FIG. 4A shows a schematic for determining the current power injections on a bus of a power distribution system according to some embodiments of the invention. The power injections 450 are determined according to the bus equivalent loads 430, and bus equivalent power generations 440. The bus equivalent loads 430 are computed according to WYE-connected and DELTA-connected loads, 410 and 415 at the bus. The bus equivalent generations 440 are computed according to WYE-connected and DELTA-connected generations 420 and 425 at the bus.

Figure 4B:
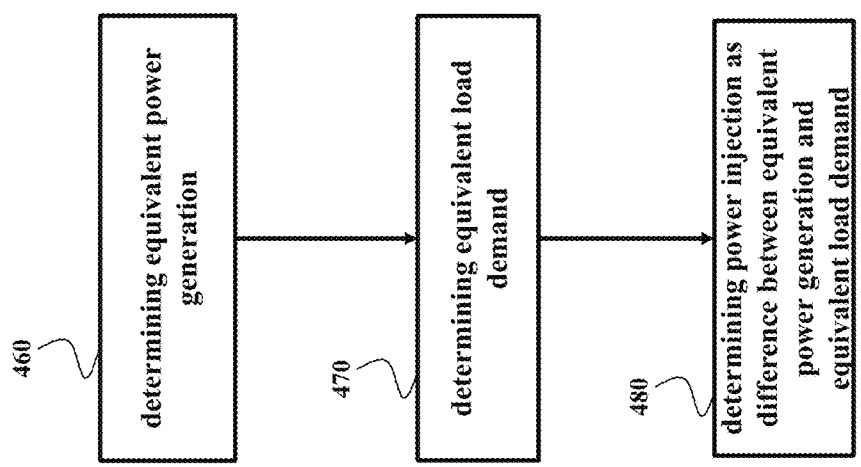
FIG. 4B is a block diagram of a method for determining the current power injection on a bus of the PDS according to one embodiment of the invention.

FIG. 4B shows a block diagram of a method for determining the current power injection on a bus of the PDS according to one embodiment of the invention. The method determines 460 an equivalent power generation based on one or combination of historical information of the power generation in the PDS and a current measurement of the power generation in the PDS and determines 470 an equivalent load demand based on one or combination of historical information of the load demand in the PDS and a current measurement of the load demand in the PDS. The method determines the current power injection as a difference between the equivalent power generation and the equivalent load demand.

For example, the current power injection for phase x of bus i, $S_{i,x}$ is determined as equivalent power generation minus equivalent load demand at the bus i and phase x:

$$S_{i,x} = S_{G_{i,x}}^{EQ} - S_{D_{i,x}}^{EQ}, \quad (9)$$

wherein, $S_{G_{i,x}}^{EQ}$ is the equivalent generation output at phase x of bus i; $S_{D_{i,x}}^{EQ}$ is the equivalent load demand at phase x of bus i. The power injection variable $S_{i,x}$ can represent either an active power injection component, or a reactive power injection component.

The equivalent phase power generation at phase x of bus i, $S_{G_{i,x}}^{EQ}$ is determined by the corresponding WYE-connected and DELTA-connected generations at bus i as:

$$S_{G_{i,x}}^{EQ} = S_{G_{i,x}}^{WYE} + \beta_G^{POS} S_{G_{i,xy}}^{DELTA} + \beta_G^{NEG} S_{G_{i,zx}}^{DELTA}, \quad (10)$$

wherein, $S_{G_{i,x}}^{WYE}$ is the generation output of WYE-connected generations at phase x, $S_{G_{i,xy}}^{DELTA}$ and $S_{G_{i,zx}}^{DELTA}$ are the generation outputs of DELTA-connected generations between phase x and phase y, and phase z and phase x respectively, $\beta_G^{POS}$ and $\beta_G^{NEG}$ are the conversion factors for DELTA-connected generations between two phases and defined based on the generation's power factor, $\cos \varphi_G$ and ideal voltage relationship between three phases as follows:

$$\beta_G^{POS} = \frac{1}{2} + \frac{\sqrt{3 - 3\cos^2\phi_G}}{6\cos\phi_G}, \beta_G^{NEG} = \frac{1}{2} - \frac{\sqrt{3 - 3\cos^2\phi_G}}{6\cos\phi_G}, \quad (11)$$

if the output is an active power, and $$\beta_G^{POS} = \frac{1}{2} - \frac{\cos\phi_G}{3\sqrt{3 - 3\cos^2\phi_G}}, \beta_G^{NEG} = \frac{1}{2} + \frac{\cos\phi_G}{3\sqrt{3 - 3\cos^2\phi_G}},$$

if the output is a reactive power,

The equivalent phase load demand at phase x of bus i, $S_{D_{i,x}}^{EQ}$ is determined by the corresponding WYE-connected and DELTA-connected loads at the bus as:

$$S_{D_{i,x}}^{EQ} = S_{D_{i,x}}^{WYE} + \beta_D^{POS} S_{D_{i,xy}}^{DELTA} + \beta_D^{NEG} S_{D_{i,zx}}^{DELTA}, \quad (12)$$

wherein, $S_{D_{i,x}}^{WYE}$ is the load demand WYE-connected loads at phase x, $S_{D_{i,xy}}^{DELTA}$ and $S_{D_{i,zx}}^{DELTA}$ are the load demands of DELTA-connected loads between phase x and phase y, and phase z and phase x respectively, $\beta_D^{POS}$ and $\beta_D^{NEG}$ are the conversion factors for DELTA-connected loads between two phases and defined based on the load power factor, $\cos \phi_D$ and ideal voltage relationship between three phases as follows:

$$\beta_D^{POS} = \frac{1}{2} + \frac{\sqrt{3 - 3\cos^2\phi_D}}{6\cos\phi_D}, \beta_D^{NEG} = \frac{1}{2} - \frac{\sqrt{3 - 3\cos^2\phi_D}}{6\cos\phi_D}, \quad (13)$$

if the demand is an active power, and $$\beta_D^{POS} = \frac{1}{2} - \frac{\cos\phi_D}{3\sqrt{3 - 3\cos^2\phi_D}}, \beta_D^{NEG} = \frac{1}{2} + \frac{\cos\phi_D}{3\sqrt{3 - 3\cos^2\phi_D}},$$

if the demand is a reactive power,

For each bus, its historical power injection data can be calculated based on the historical data of load demands, and distributed generations connected to the bus through WYE or DELTA connection accordingly. Meanwhile, the prediction for bus power injection can also be implemented through predictions of all connection-type load demands, and distributed generations accordingly.

Due to the large number of buses, the loads of a power distribution system can be aggregated together into several groups to be calculated or predicted. During the state estimation, the aggregated loads need to be allocated to each bus and each phase based on its typical load profile, or maximum capacity. For example, for a feeder section, we only know the power flows at the upstream and downstream boundaries of the feeder portion. Each load in the feeder portion can be determined as a product of a scaling factor and a base power defined by a typical load profile of the load. The scaling factor can be determined by iteratively solving a power flow on the feeder portion using various scaling factors until an optimal scaling factor has been found which enables the solved power flows at boundaries matching the given values closely. Moreover, we can also use the solved power flows on the line segments or other devices within the section as pseudo measurements if there is no enough measurements for the system.

Power Injection Transition Model

There are various complicated forecasting techniques including regression analysis, time series that can be used to derive power injection transition model. However, the estimation interval for dynamic state estimation is relatively short, (for example, a few minutes or less), it is unnecessary to use those techniques for the dynamic state estimation application. For example, one embodiment of the invention uses double exponential smoothing technique as described below.

The power injection transition model can be derived either based on power injections data directly, or based on separate generations and loads for each connection type. For example, based on the historical, current and/or forecast data some embodiments determine the level of the new power injection and the trend for new power injection based on new observation for power injections, and historical levels and trends of power injections.

For example, the level and the trend of power injection can be determined based on historical data and updated, e.g., periodically, randomly or on demand, based on forecasted or measured power generation and load demand in the PDS.

Figure 4C:
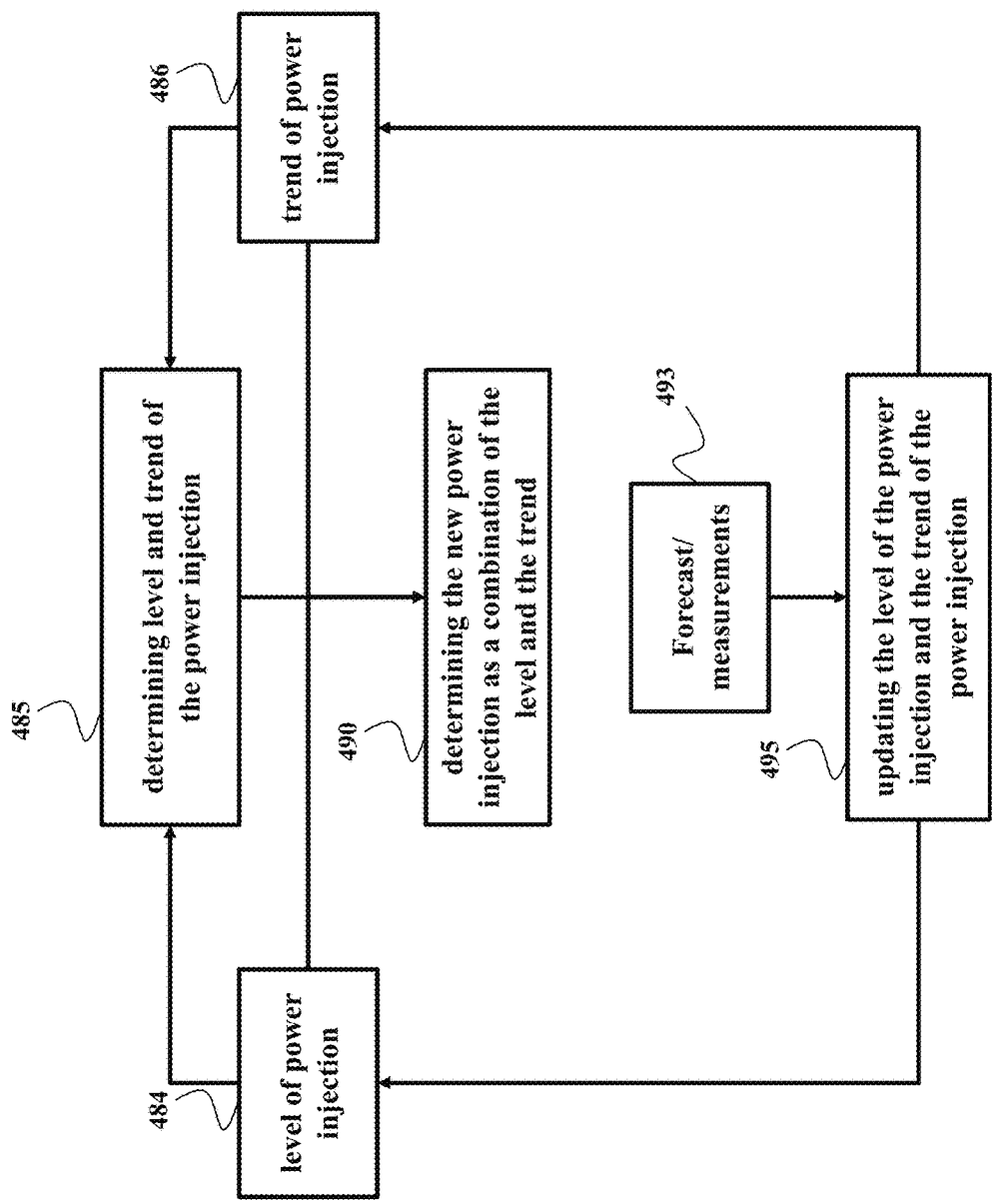
FIG. 4C is a schematic of a method for determining the new power injection according to power injection transition model of one embodiment of the invention.

FIG. 4C shows a schematic of a method for determining the new power injection according to power injection transition model of one embodiment of the invention. The method determines 485 the level 484 of the power injection and the trend 486 of the power injection as a function of the current power injection, a previous values of the level of the power injection and the trend of the power injection. In various embodiments, the method is performed iteratively. To that end the level 484 and the trend 486 determined for one iteration become the previous values of the level and the trend of the power injection.

The method determines 490 the new power injection as a combination of the level of the power injection and the trend of the power injection. The method can also update the level of the power injection and the trend of the power injection based on forecasted or measured power generation and load demand in the PDS.

In some embodiments, the transition model of power injections is defined for each bus and each phase separately. The projection of power injection for the one interval ahead includes two components, one is the level, and the other is the trend. For a given power injection estimate at time interval (k−1), $\hat{S}_{i,x}(k-1)$, its projected power injection at time interval k, $S_{i,x}^-(k)$ can be determined as:

$$S_{i,x}^-(k) = L_{i,x}(k-1) + T_{i,x}(k-1),$$

$$L_{i,x}(k-1) = \alpha_f \hat{S}_{i,x}(k-1) + (1-\alpha_f)[L_{i,x}(k-2) + T_{i,x}(k-2)],$$
$$0 \leq \alpha_f \leq 1,$$

and $$T_{i,x}(k-1) = \beta_f[L_{i,x}(k-1) - L_{i,x}(k-2)] + (1-\beta_f)T_{i,x}(k-2),$$
$$0 \leq \beta_f \leq 1, \quad (14)$$

wherein $L_{i,x}(k-1)$ and $T_{i,x}(k-1)$ represent the level and trend of the data at interval (k−1). $L_{i,x}(k-2)$ and $T_{i,x}(k-2)$ represent the level and trend of the data at interval (k−2). $\alpha_f$ and $\beta_f$ are the smoothing constants for the levels and the trends, respectively. For example, we can set $\alpha_f = 0.3$, and $\beta_f = 0.2$.

The trends and levels of power injections for each pair of bus and phase are updated for each new time interval. For example, after we get the actual or forecasted loads and generations for each connection type at time interval k, we can get an equivalent power injection at time interval k, $\hat{S}_{i,x}(k)$ as follows:

$$\hat{S}_{i,x}(k) = \hat{S}_{G_{i,x}}^{WYE}(k) + \beta_G^{POS}\hat{S}_{G_{i,xy}}^{DELTA}(k) + \beta_G^{NEG}\hat{S}_{G_{i,zx}}^{DELTA}(k) - \hat{S}_{D_{i,x}}^{WYE}(k) - \beta_D^{POS}\hat{S}_{D_{i,xy}}^{DELTA}(k) - \beta_D^{NEG}\hat{S}_{D_{i,zx}}^{DELTA}(k), \quad (15)$$

wherein $\hat{S}_{G_{i,x}}^{WYE}(k)$, $\hat{S}_{G_{i,xy}}^{DELTA}(k)$ and $\hat{S}_{G_{i,zx}}^{DELTA}(k)$ are the generation outputs of WYE-connected generation at phase x, DELTA-connected generations between phase x and phase y, and phase z and phase x; $\hat{S}_{D_{i,x}}^{WYE}(k)$, $\hat{S}_{D_{i,xy}}^{DELTA}(k)$ and $\hat{S}_{D_{i,zx}}^{DELTA}(k)$ are the load demands of WYE-connected loads at phase x, DELTA-connected loads between phase x and phase y, and phase z and phase x, respectively. Using the determined power injection, $\hat{S}_{i,x}(k)$, we can get an new power injection prediction for time interval (k+1), and update for level and trend of actual power injection at time interval k according to:

$$S_{i,x}^-(k+1) = L_{i,x}(k) + T_{i,x}(k),$$

$$L_{i,x}(k) = \alpha_f \hat{S}_{i,x}(k) + (1-\alpha_f)[L_{i,x}(k-1) + T_{i,x}(k-1)], \text{ and}$$

$$T_{i,x}(k) = \beta_f[L_{i,x}(k) - L_{i,x}(k-1)] + (1-\beta_f)T_{i,x}(k-1). \quad (16)$$

Dynamic State Estimation Using Unscented Kalman Filter

Figure 5:
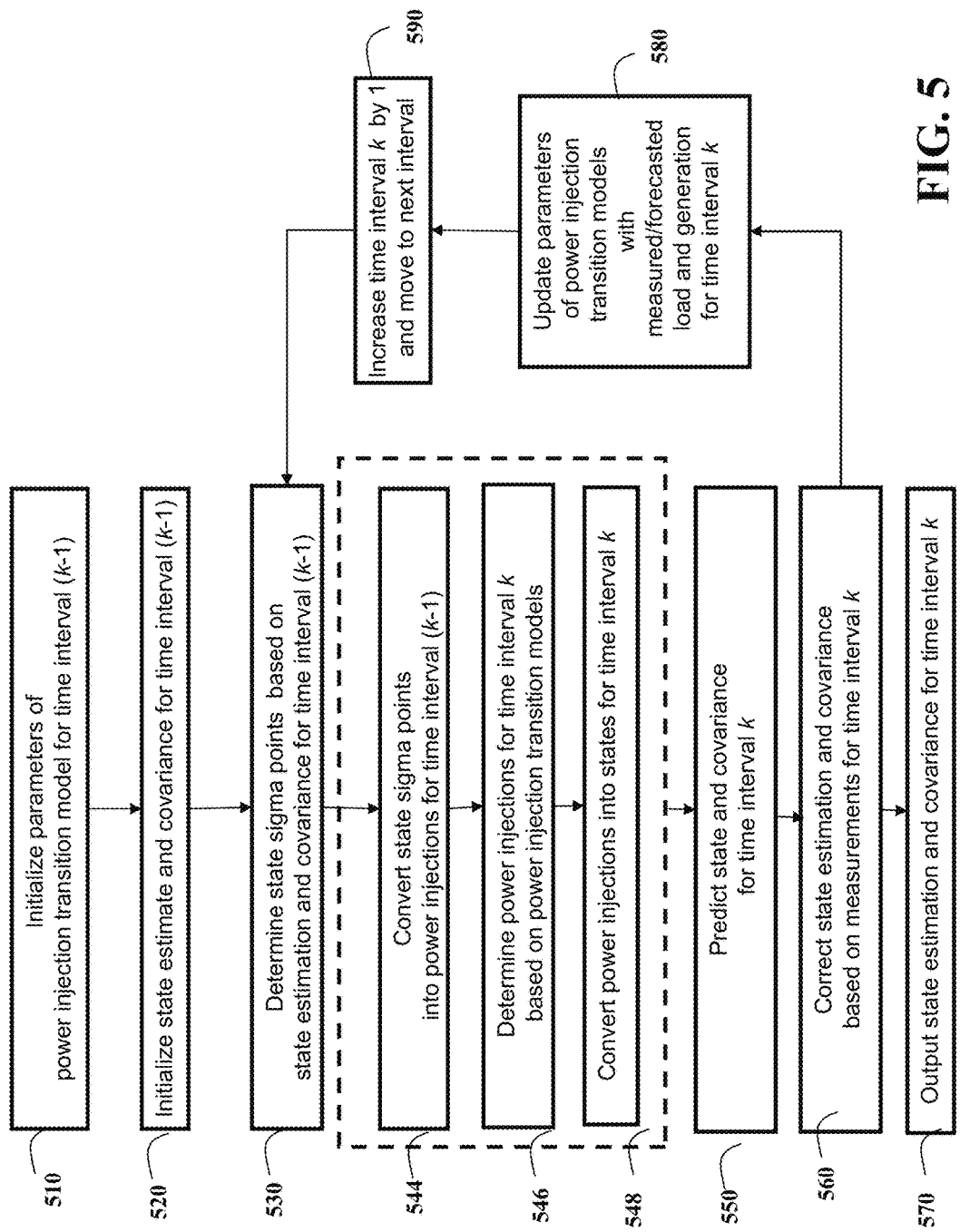
FIG. 5 is a flow chart for a method for dynamic state estimation of the power distribution system at an arbitrary time interval k according to some embodiments of the invention.

FIG. 5 shows a flow chart for a method for dynamic state estimation of the power distribution system at an arbitrary time interval k according to some embodiments of the invention. In these embodiments, the current and new states include a distribution of values of the new states for each phase of each bus to reflect the uncertainties of the values of the states.

The embodiments initialize 510 the levels and trends of actual power injections at time interval (k−2), L(k−2), T(k−2), and initialize 520 the mean and corresponding covariance matrix of state estimate at time interval (k−1), $\hat{x}(k-1)$ and P(k−1).

The embodiments determine 530 a set of sample points, X(k−1) that represents different possible values of the estimated state at interval (k−1), based on the mean and covariance of state estimate at interval (k−1), $\hat{x}(k-1)$ and P(k−1). The total number of sample points is $(2n_s+1)$, and its sample point l, $X^l(k-1)$, i.e. the column l of X(k), is determined according to:

$$X^l(k-1) = \hat{x}(k-1), \text{ if } l=0,$$

$$X^l(k-1) = \hat{x}(k-1) + \sqrt{\lambda+n_s}\sqrt{P(k-1)}, \text{ if } l=1,2,\ldots,n_s,$$

$$X^l(k-1) = \hat{x}(k-1) - \sqrt{\lambda+n_s}\sqrt{P(k-1)}, \text{ if } l=n_s+1,2,\ldots,2n_s, \quad (17)$$

wherein $n_s$ is the number of state variables, $\lambda = \alpha_s^2(n_s+\kappa) - n_s$, $\alpha_s$ and $\kappa$ are the parameters that determine the spread of the sigma points around. The square root of the covariance matrix, P(k−1) can be solved using the Cholesky factorization method.

The embodiments determine 544, based on the each column l of X(k−1), $X^l(k-1)$, l=0, 1, ..., $2n_s$, a calculated l-th sample injection vector $\tilde{S}^l(k-1)$ using power flow equations (3) and use 546 $\tilde{S}^l(k-1)$ and historical injection data to forecast a calculated sample power injection at interval k, $\tilde{S}^l(k)$ according to (18).

$$\tilde{S}^l(k) = \tilde{L}^l(k-1) + \tilde{T}^l(k-1),$$

$$\tilde{L}^l(k-1) = \alpha_f \tilde{S}^l(k-1) + (1-\alpha_f)[L(k-2) + T(k-2)],$$

$$\tilde{T}^l(k-1) = \beta_f[\tilde{L}^l(k-1) - L(k-2)] + (1-\beta_f)T(k-2). \quad (18)$$

wherein $\tilde{L}^l(k-1)$ and $\tilde{T}^l(k-1)$ are the levels and trends for the l-th sample point of power injections at time interval (k−1).

The embodiments solves 548 power flow equations (3) using a nonlinear equation technique, such as Newton method to determine a corresponding l-th sample state estimation for interval k, $\hat{X}^l(k)$ by taken the determined l-th sample power injection $\tilde{S}^l(k)$ as the bus power injections.

Next, the embodiments use 550 $\hat{X}^l(k)$, l=0, 1, ..., $2n_s$ to predict state and covariance for interval k, $x^-(k)$ and $P^-(k)$ according to:

$$x^-(k) = \sum_{l=0}^{2n_s} W_l^m \hat{X}^l(k), \quad (19)$$

$$P^-(k) = \sum_{l=0}^{2n_s} W_l^c\left[\left(\hat{X}^l(k) - x^-(k)\right)\left(\hat{X}^l(k) - x^-(k)\right)^T\right] + Q(k-1), \quad (20)$$

where, $W_0^c = \lambda/(n_s+\lambda) + 1 - \alpha_s^2 + \beta_s$, $W_0^m = \lambda/(n_s+\lambda)$, $W_l^m = W_l^c = 0.5/(n_s+\lambda)$, $\beta_s$ is a parameter to incorporate prior knowledge of the distribution of state variable. The parameters for unscented Kalman filters are pre-determined, for example, we can set: $\alpha_s = 1.0$, $\kappa = 0$, and $\beta_s = 2.0$.

The embodiments correct 560 predicted $x^-(k)$ and covariance matrix $P^-(k)$ with Kalman gain K(k) to generate the estimated state and covariance for interval k, $\hat{x}(k)$ and P(k) according to:

$$\hat{x}(k) = x^-(k) + K(k)[y(k) - y^-(k)], \quad (21)$$

$$P(k) = P^-(k) - K(k)P_{YY}(k)K^T(k), \quad (22)$$

$$K(k) = P_{XY}(k)P_{YY}^{-1}(k), \quad (23)$$

$$y^-(k) = \sum_{l=0}^{2n_s} W_l^m Y^l(k), \quad (24)$$

-continued $$Y^{-l}(k) = h(X^{-l}(k), k), \quad (25)$$

$$P_{YY}(k) = \sum_{l=0}^{2n_s} W_l^c[(Y^{-l}(k) - y^-(k))(Y^{-l}(k) - y^-(k))^T] + R(k), \quad (26)$$

$$P_{XY}(k) = \sum_{l=0}^{2n_s} W_l^c[(X^{-l}(k) - x^-(k))(Y^{-l}(k) - y^-(k))^T], \quad (27)$$

$$X^{-l}(k) = x^-(k), \text{ if } l = 0, \quad (28)$$
$$X^{-l}(k) = x^-(k) + \sqrt{\lambda + n_s}\sqrt{P^-(k)}, \text{ if } l = 1, 2, \ldots, n_s,$$
$$X^{-l}(k) = x^-(k) - \sqrt{\lambda + n_s}\sqrt{P^-(k)}, \text{ if } l = n_s + 1, 2, \ldots, 2n_s,$$

where, $x^{-l}(k)$ is the l-column of $x^-(k)$, $Y^{-l}(k)$ is the l-column of $Y^-(k)$.

Next, the embodiments output 570 the state estimation and covariance for interval k, $\hat{x}(k)$ and P(k), and determine 580 actual or forecasted bus power injections, $\hat{S}_k$ for step interval k according to the measured or forecasted load demands and distributed generations at interval k as (29), and then update the levels and trends for actual power injections at interval k, L(k) and T(k) according to (30):

$$\hat{S}_{i,x}(k) = \hat{S}_{G_{i,x}}^{WYE}(k) + \beta_G^{POS}\hat{S}_{G_{i,xy}}^{DELTA}(k) + \\ \hat{S}_{G_{i,zx}}^{DELTA}(k) - \hat{S}_{D_{i,x}}^{WYE}(k) - \beta_D^{POS}\hat{S}_{D_{i,xy}}^{DELTA}(k) - \\ \beta_D^{NEG}\hat{S}_{D_{i,zx}}^{DELTA}(k), \quad (29)$$

$$L(k) = \alpha_f \hat{S}(k) + (1-\alpha_f)[L(k-1) + T(k-1)], \text{ and}$$

$$T(k) = \beta_f[L(k) - L(k-1)] + (1-\beta_f)T(k-1), \quad (30)$$

wherein $\hat{S}_{G_{i,x}}^{WYE}(k)$, $\hat{S}_{G_{i,xy}}^{DELTA}(k)$ and $\hat{S}_{G_{i,zx}}^{DELTA}(k)$ are the power outputs of WYE-connected generations at phase x, DELTA-connected generations between phase x and phase y, and phase z and phase x; $\hat{S}_{D_{i,x}}^{WYE}(k)$, $\hat{S}_{D_{i,xy}}^{DELTA}(k)$ and $\hat{S}_{D_{i,zx}}^{DELTA}(k)$ are the power consumptions of WYE-connected loads at phase x, DELTA-connected loads between phase x and phase y, and phase z and phase x, respectively.

In step 590, the embodiments increase k by 1 and move the execution to the Next Iteration.

Computation Acceleration with Parallel Implantation

Compared with the existing UKF based dynamic state estimation method, different embodiments yield more accurate state estimation results, and much easier to implement. The only trade-off is the increased computation burden caused by the power flow solution for transformation power injection into system states.

To maintain desired computational efficiency for real-time applications, one embodiment uses parallel computation techniques to expedite the power flow solutions when executing state transition. The embodiment allocates multiple cores to work in parallel to solve power flows for different state estimates. Different than existing approach that parallelizes dynamic state estimation through system decomposition, the invention implements the parallelization directly to the estimation program itself.

As discussed above, the trade-off of the proposed method is the increased computation caused by repetitive power flow solution in the stage of state prediction. A simple inspection of the prediction step reveals that the propagation of the X(k−1), described in the steps 544, 546 and 548 of above section is inter-independent column-wise, which means the columns in X(k−1) can be evaluated in parallel if there are multiple computation threads. This leads to the idea of using parallel implementation of the proposed method in this invention.

Figure 6:
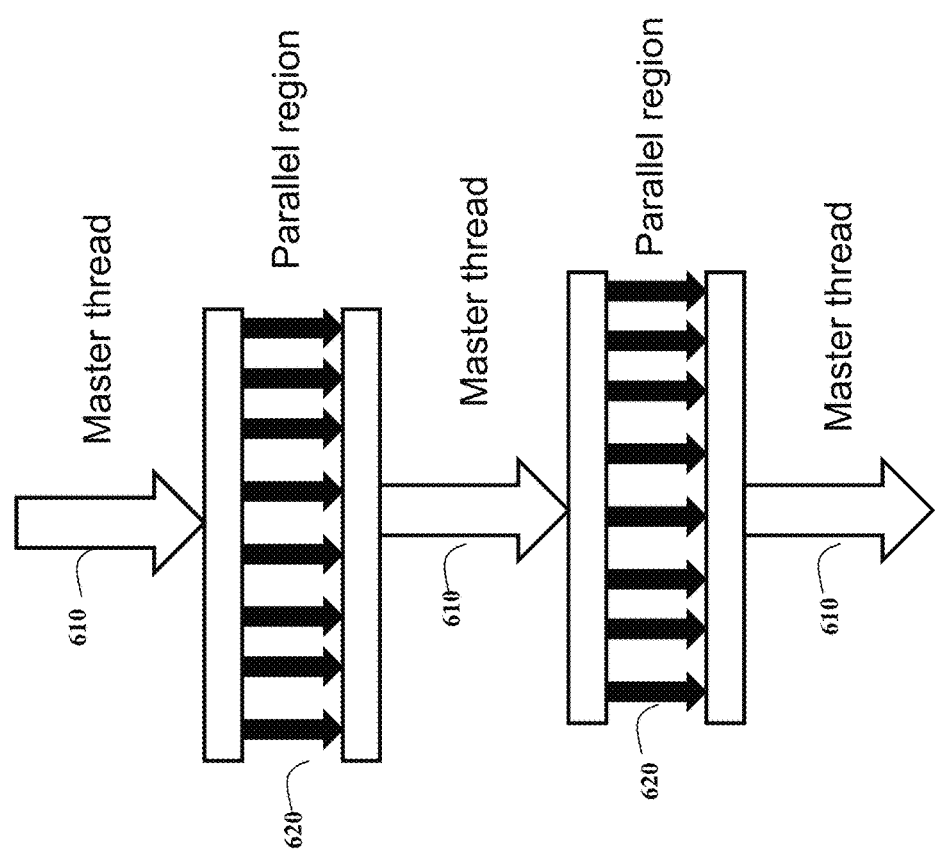
FIG. 6 is a schematic of computation acceleration using parallel implementation according to some embodiments of the invention.

FIG. 6 shows a schematic of computation acceleration using parallel implementation according to some embodiments of the invention. The parallel implementation can start single-threaded 610 (using the "master thread") and then enter a parallel region 620 with multiple threads ("master" and "slave" threads) running simultaneously using shared memory. The program can go back to the master thread after the parallel region ends.

In the case of the proposed method, each thread can work on a bundle of columns in the X(k−1) matrix depending on their thread IDs. Besides the propagation of the X(k−1) through power flow solutions, the propagation of X⁻(k) through measurement equations, i.e. the step 560 can also be achieved through parallel computation. In this way, it's expected that a speed-up can be achieved at a ratio that is increasing with the number of threads used.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

The invention claimed is:

1. A method for dynamic state estimation (DSE) in a power distribution system (PDS) with distributed generations, comprising:
   determining a state at a future time interval of the PDS from a state at a current time interval of the PDS via an indirect state transition model defining a transition of the state at the current time interval of the PDS to the state at the future time interval of the PDS through a transition of a power injection at the current time interval to a power injection at the future time interval on each bus of the PDS, wherein the state at the future time interval defines an estimation of power flows, power injections, voltage magnitudes and phase angles for the buses in PDS including measuring buses in the PDS;

measuring one or a combination of power flows, power injections, voltage magnitudes and phase angles on the measuring buses in the PDS; and updating the state at the future time interval of the PDS based on corresponding differences between one or a combination of the estimated power flows, the estimated power injections, the estimated voltage magnitudes and the estimated phase angles with the measured power flows, the measured power injections, the measured voltage magnitudes and the measured phase angles, wherein at least some steps of the method are performed by a processor.

2. The method of claim 1, wherein the determining the state at the future time interval comprises:

transforming the states at the current time interval of the PDS into the power injection at the current time interval on each bus of the PDS;

determining the power injection at the future time interval on each bus of the PDS from the power injection at the current time interval using a level and a trend of the power injection;

transforming the power injection at the future time interval into the state at the future time interval of the PDS.

3. The method of claim 2, further comprising:

determining the power generation at the current time interval based on one or combination of historical information of the power generation in the PDS and a measurement at the current time interval of the power generation in the PDS;

determining a load demand at the current time interval based on one or combination of historical information of the load demand in the PDS and a measurement at the current time interval of the load demand in the PDS; and determining the power injection at the current time interval as a difference between the power generation at the current time interval and the load demand at the current time interval.

4. The method of claim 3, wherein the power injection the current time interval for a phase of a bus is determined as an equivalent power generation at the bus and the phase minus an equivalent load demand at the bus and the phase according to:

$S_{i,x} = S_{G_{i,x}}^{EQ} - S_{D_{i,x}}^{EQ}$ wherein $S_{i,x}$ is the power injection the current time interval at the phase x of the bus i, $S_{G_{i,x}}^{EQ}$ the equivalent power generation at the phase x of the bus i, $S_{D_{i,x}}^{EQ}$ is the equivalent load demand at the phase x of the bus i, wherein the power injection the current time interval is one or combination of an active power injection component and a reactive power injection component at the bus i and the phase x.

5. The method of claim 4, wherein the $S_{G_{i,x}}^{EQ}$ is determined by corresponding WYE-connected and DELTA-connected generations at the bus i according to $S_{G_{i,x}}^{EQ} = S_{G_{i,x}}^{WYE} + \beta_G^{POS} S_{G_{i,xy}}^{DELTA} + \beta_G^{NEG} S_{G_{i,zx}}^{DELTA}$, wherein $S_{G_{i,x}}^{WYE}$ is a generation output of the WYE-connected generations at the phase x, $S_{G_{i,xy}}^{DELTA}$ is a generation output of the DELTA-connected generations between the phase x and a phase y, and $S_{G_{i,zx}}^{DELTA}$ is a generation output of the DELTA-connected generations between a phase z and the phase x respectively, $\beta_G^{POS}$ and $\beta_G^{NEG}$ are conversion factors for DELTA-connected generations at different phases and defined based on rated power factor $\cos \varphi_G$ of the generations according to $$\beta_G^{POS} = \frac{1}{2} + \frac{\sqrt{3 - 3\cos^2 \phi_G}}{6\cos\phi_G}, \beta_G^{NEG} = \frac{1}{2} - \frac{\sqrt{3 - 3\cos^2 \phi_G}}{6\cos\phi_G},$$

if the output is an active power, and $$\beta_G^{POS} = \frac{1}{2} - \frac{\cos\phi_G}{3\sqrt{3 - 3\cos^2 \phi_G}}, \beta_G^{NEG} = \frac{1}{2} + \frac{\cos\phi_G}{3\sqrt{3 - 3\cos^2 \phi_G}},$$

if the output is a reactive power, and wherein $S_{D_{i,x}}^{EQ}$ is determined by the corresponding WYE-connected and DELTA-connected loads at the bus i according to $S_{D_{i,x}}^{EQ} = S_{D_{i,x}}^{WYE} + \beta_D^{POS} S_{D_{i,xy}}^{DELTA} + \beta_D^{NEG} S_{D_{i,zx}}^{DELTA}$, wherein, $S_{D_{i,x}}^{WYE}$ is a load demand of WYE-connected loads at the phase x, $S_{D_{i,xy}}^{DELTA}$ is a load demand of DELTA-connected loads between the phase x and a phase y, and $S_{D_{i,zx}}^{DELTA}$ is a load demand of DELTA-connected loads between a phase z and the phase x respectively, $\beta_D^{POS}$ and $\beta_D^{NEG}$ are conversion factors for DELTA-connected loads and defined based on a load rated power factor $\cos \varphi_D$ according to $$\beta_D^{POS} = \frac{1}{2} + \frac{\sqrt{3 - 3\cos^2 \phi_D}}{6\cos\phi_D}, \beta_D^{NEG} = \frac{1}{2} - \frac{\sqrt{3 - 3\cos^2 \phi_D}}{6\cos\phi_D},$$

if the demand is an active power, and $$\beta_D^{POS} = \frac{1}{2} - \frac{\cos\phi_D}{3\sqrt{3 - 3\cos^2 \phi_D}}, \beta_D^{NEG} = \frac{1}{2} + \frac{\cos\phi_D}{3\sqrt{3 - 3\cos^2 \phi_D}},$$

if the demand is a reactive power.

6. The method of claim 2, further comprising:

determining the level of the power injection and the trend of the power injection as a function of the power injection at the current time interval, a previous values of the level of the power injection and the previous trend of the power injection; and determining the power injection at the future time interval as a combination of the level of the power injection and the trend of the power injection.

7. The method of claim 6, wherein the determining the power injection for each sample state l at time interval k, $\tilde{S}^l(k)$ according to:

$\tilde{S}^l(k) = \tilde{L}^l(k-1) + \tilde{T}^l(k-1)$, $\tilde{L}^l(k-1) = \alpha_f \tilde{S}^l(k-1) + (1-\alpha_f)[L(k-2) + T(k-2)]$, $\tilde{T}^l(k-1) = \beta_f[\tilde{L}^l(k-1) - L(k-2)] + (1-\beta_f)T(k-2)$, wherein $\tilde{L}^l(k-1)$ and $\tilde{T}^l(k-1)$ are the level and trend of power injections corresponding to sample state l at time interval (k−1), L(k−2) and T(k−2) are the level and trend of power injections corresponding to actual state at time interval (k−2), $\alpha_f$ and $\beta_f$ are the smoothing factors for the levels and trends.

8. The method of claim 6, further comprising:
updating the level of the power injection and the trend of the power injection based on forecasted or measured power generation and load demand in the PDS.

9. The method of claim 8, wherein the updating of the level of the actual power injection, L(k) and the trend of the actual power injection T(k) for a time interval k based on the measured or forecasted power generation and load demand at interval k available according to:

$$L(k)=\alpha_f\hat{S}(k)+(1-\alpha_f)[L(k-1)+T(k-1)], \text{ and}$$

$$T(k)=\beta_f[L(k)-L(k-1)]+(1-\beta_f)T(k-1),$$

wherein L(k−1) and T(k−1) are the level and trend of power injections corresponding to actual state at time interval (k−1).

10. The method of claim 1, wherein the updating is performed using an unscented Kalman filter.

11. The method of claim 10, wherein the state at the future time interval includes a distribution of values of the states at the future time interval for each phase of each bus, and wherein the updating comprises:
determining a predicted mean vector x⁻(k) and a predicted covariance matrix P⁻(k) of the distribution of values of the states at the future time interval for each phase of each bus;
correcting the predicted mean vector x⁻(k) and the predicted covariance matrix P⁻(k) with the measurements of power flows, power injections, voltage magnitudes and phase angles, y(k) to produce an estimated mean vector x̂(k) and an estimated covariance matrix P(k); and
updating the state at the future time interval according to the estimated mean vector x̂(k) and the estimated covariance matrix P(k).

12. The method of claim 11, wherein the estimated mean vector i(k) and the estimated covariance matrix P(k) are determined according to:

$$\hat{x}(k) = x^-(k) + K(k)[y(k) - y^-(k)],$$

$$P(k) = P^-(k) - K(k)P_{YY}(k)K^T(k),$$

$$K(k) = P_{XY}(k)P_{YY}^{-1}(k),$$

$$y^-(k) = \sum_{l=0}^{2n_s} W_l^m Y^{-l}(k),$$

$$Y^{-l}(k) = h(X^{-l}(k), k),$$

$$P_{YY}(k) = \sum_{l=0}^{2n_s} W_l^c [(Y^{-l}(k) - y^-(k))(Y^{-l}(k) - y^-(k))^T] + R(k),$$

$$P_{XY}(k) = \sum_{l=0}^{2n_s} W_l^c [(X^{-l}(k) - x^-(k))(Y^{-l}(k) - y^-(k))^T],$$

$$X^{-l}(k) = x^-(k), \text{ if } l = 0,$$

$$X^{-l}(k) = x^-(k) + \sqrt{\lambda+n_s}\sqrt{P^-(k)}, \text{ if } l = 1, 2, \ldots, n_s,$$

$$X^{-l}(k) = x^-(k) - \sqrt{\lambda+n_s}\sqrt{P^-(k)}, \text{ if } l = n_s+1, 2, \ldots, 2n_s,$$

$$x^-(k) = \sum_{l=0}^{2n_s} W_l^m \hat{x}^l(k),$$

$$P^-(k) = \sum_{l=0}^{2n_s} W_l^c [(\hat{x}^l(k) - x^-(k))(\hat{x}^l(k) - x^-(k))^T] + Q(k-1),$$

wherein $W_0^c=\lambda/(n_s+\lambda)+1-\alpha_s^2+\beta_s$, $W_0^m=\lambda/(n_s+\lambda)$, $W_l^m=W_l^c=0.5/(n_s+\lambda)$, $\lambda=\alpha_s^2(n_s+\kappa)-n_s$, $n_s$ is the number of state variables, $\alpha_s$ and $\kappa$ are the parameters that determine the spread of the sample points around, $\beta_s$ is a parameter to incorporate prior knowledge of the distribution of state variable, h(•) is a measurement model that relates the measurements to variables of the subsequent state, R(k) is a covariance matrix of measurement noises at time interval k, Q(k−1) is a covariance matrix of state noises at time interval (k−1), and K(k) is a Kalman gain at time interval k, x̂ˡ(k) is the predicted sample state l at internal k that determined using indirect state transition model from the sample state l at interval (k−1), Xˡ(k−1) defined according to estimated mean x̂(k−1) and covariance P(k−1) at interval (k−1):

$$X^l(k-1)=\hat{x}(k-1), \text{ if } l=0,$$

$$X^l(k-1)=\hat{x}(k-1)+\sqrt{\lambda+n_s}\sqrt{P(k-1)}, \text{ if } l=1,2,\ldots,n_s,$$

$$X^l(k-1)=\hat{x}(k-1)-\sqrt{\lambda+n_s}\sqrt{P(k-1)}, \text{ if } l=n_s+1,2,\ldots,2n_s.$$

13. The method of claim 1, further comprising:
determining voltages on the buses from the states at the future time interval of the PDS; and
controlling voltage regulation devices of the PDS to drive the voltages on the buses toward a predetermine level.

14. The method of claim 1, further comprising:
determining voltages on the buses from the states at the future time interval of the PDS; and
controlling one or combination of a power generation and a load demand in the PDS, wherein the controlling includes adjusting an active or a reactive power injection into a bus when voltage on the bus is below a first threshold and adjusting the active or the reactive power injection into the bus when voltage on the bus is above a second threshold.

15. The method of claim 1, further comprising:
determining voltages on the buses from the states at the future time interval of the PDS; and
rendering voltage phase angles and magnitudes for each bus of the PDS on a display of a PDS control system.

16. A method for dynamic state estimation (DSE) in a power distribution system (PDS) with distributed renewable generations, comprising:
determining an indirect state transition model defining a transition of a state at a current time interval of the PDS to a state at a future time interval of the PDS through a transition of a power injection at the current time interval to a power injection at the future time interval on each bus of the PDS;
determining the transition of the power injection at the curent time interval to the power injection at the future time interval using a level of the power injection at the current time interval and a trend of the power injection at the current time interval;
determining the state at the future time interval of the PDS from the power injection at the future time interval; and
updating the state at the future time interval of the PDS based on corresponding differences between power flows at the future time interval, power injections at the future time interval, voltage magnitudes at the future time interval and phase angles at the future time interval corresponding to the state at the future time interval with measurements of power flows, power injections, voltage magnitudes and phase angles for at least some buses in the PDS, wherein at least some steps of the method are performed by a processor.

17. A control system of a power distribution system (PDS), comprising:
a memory to store a state at a current time interval of the PDS and an indirect state transition model defining a transition of the state at the current time interval of the PDS to a state at a future time interval of the PDS through a transition of a power injection at the current time interval to a power injection at the future time interval on each bus of the PDS;
a set of sensors arranged at measuring buses in the PDS to measure one or combination of power flows, power injections, voltage magnitudes and phase angles on the measuring buses in the PDS; and
a processor to determine a state at the future time interval of the PDS from the state at the current time interval of the PDS via the indirect state transition model and to update, using a unscented Kalman filter, the state at the future time interval of the PDS based on corresponding differences between one or combination of corresponding differences between power flows at the future time interval, power injections at the future time interval, voltage magnitudes at the future time interval and phase angles at the future time interval corresponding to the state at the future time interval with the measurements of power flows, power injections, voltage magnitudes and phase angles for at least some buses in the PDS.

18. The control system of claim 17, wherein the memory stores a set of instruction configuring the processor to determine the state at the future time interval by
transform the states of the PDS into the power injection on each bus of the PDS;
determine the power injection at the future time interval on each bus of the PDS from the power injection using a level and a trend of the power injection;
transform the power injection at the future time interval into the state at the future time interval of the PDS.

19. The control system of claim 17, further comprising:
a display, wherein the processor determines voltages on the buses from the states at the future time interval of the PDS and renders voltage phase angles and magnitudes for each bus of the PDS on the display of the control system.

20. The system of claim 17, further comprising:
voltage regulation devices, wherein the processor determines voltages on the buses from the states at the future time interval of the PDS and controls the voltage regulation devices of the PDS to drive the voltages on the buses toward a predetermine level.

* * * * *